United States Patent
Montmeat et al.

(10) Patent No.: US 12,230,508 B1
(45) Date of Patent: Feb. 18, 2025

(54) SUBSTRATE STRUCTURING METHOD

(71) Applicant: Commissariat à l'Énergie Atomique et aux Énergies Alternatives, Paris (FR)

(72) Inventors: Pierre Montmeat, Grenoble (FR); Franck Fournel, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 18/805,861

(22) Filed: Aug. 15, 2024

(51) Int. Cl.
*H01L 21/321* (2006.01)
*H01L 21/311* (2006.01)
*H01L 21/3213* (2006.01)

(52) U.S. Cl.
CPC .. *H01L 21/32139* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 2005/0263025 A1 | 12/2005 | Blees | |
| 2009/0001049 A1* | 1/2009 | Whitesides | G03F 7/0002 216/41 |
| 2011/0017705 A1 | 1/2011 | Jalabert | |

OTHER PUBLICATIONS

Written Opinion of the French Application No. 2308800, dated Mar. 21, 2024.
Preliminary Search Report for French Application No. 2308800, dated Mar. 21, 2024.
Lee et al., Multifunctional self-assembled monolayers via microcontact printing and degas-driven flow guided patterning. Scientific Reports. Nov. 13, 2018;8(1):16763 (p. 1-3).

\* cited by examiner

*Primary Examiner* — Roberts P Culbert
(74) *Attorney, Agent, or Firm* — Wolf, Greenfield & Sacks, P.C.

(57) ABSTRACT

A method comprising the following steps: a) Bonding a handle substrate including raised elements to a substrate of interest including a support substrate covered with a thin film including a material sensitive to an etchant, whereby the thin film includes first areas not covered with the raised elements and second areas covered with said elements, b) Placing into contact the obtained assembly with a solution including a hydrophobic agent, to cover the first areas with a hydrophobic film, c) Separating the two substrates, d) Placing into contact the substrate of interest with a solution containing the etchant, whereby the material sensitive to the etchant present in the second areas is etched and raised patterns are formed.

11 Claims, 3 Drawing Sheets

SUBSTRATE STRUCTURING METHOD

CROSS REFERENCE TO RELATED APPLICATIONS

This application claims priority to French application number 2308800, filed Aug. 18, 2023. The contents of this application are incorporated by reference in its entirety.

TECHNICAL FIELD

The present disclosure generally concerns the field of microelectronics and more particularly the forming of patterns on a substrate for the manufacturing of microelectronic components.

PRIOR ART

The manufacturing of microelectronic components requires the forming of patterns on a substrate by photolithography.

Photolithography is performed via different steps implementing a resin: spreading of the resin on a substrate, exposure of the resin with a mask, developing, etching, and then stripping of the resin. The stripping (or resin cleaning) step is a complex step, since it requires finding a cleaning agent which is sufficiently aggressive to perfectly clean the resin while preserving the integrity of the different surfaces.

For each substrate on which microelectronic components have to be formed, these different steps are repeated. Now, these steps are not only long to implement, but they also generate significant costs, due in particular to the use of the resins, of the solvents, and of the cleaning solutions used.

SUMMARY OF THE INVENTION

There exists a need to obtain a method which enables to form patterns on a substrate while limiting costs and the duration of the method as compared with current methods.

This aim is achieved by a method of forming patterns on a substrate comprising the following steps:
a) Bonding a handle substrate to a substrate of interest, the handle substrate comprising a base and raised elements covering the base, the substrate of interest comprising a support substrate covered with a thin film, the thin film comprising a material sensitive to an etchant, whereby the thin film comprises first areas not covered with the raised elements and second areas covered with the raised elements,
b) Forming a hydrophobic layer on the first areas of the thin film, for example by placing into contact the assembly obtained at step a) with a solution comprising a hydrophobic compound,
c) Separating the handle substrate from the substrate of interest,
d) Placing into contact the substrate of interest with an aqueous solution comprising the etchant, whereby the material sensitive to the etchant present in the second areas of the thin film is etched and raised patterns are formed.

An embodiment provides for the thin film to comprise a base material, the base material preferably being a semiconductor material, for example silicon, or an oxide, for example a silicon oxide.

Another embodiment provides for the thin film to comprise a base material, for example an oxide, preferably a silicon oxide, having pads, preferably metal pads, and even more preferably copper pads, arranged therein.

An alternative embodiment provides for the material sensitive to the etchant to be the base material.

Another alternative embodiment provides for the material sensitive to the etchant to correspond to the pads.

Another embodiment provides for the thin film to comprise barriers, preferably metal barriers, and more particularly copper barriers, forming a lateral protection all around the second areas.

According to an alternative embodiment, during the etch step, the barriers and the pads are etched.

According to another alternative embodiment, the method comprises, after step c), an additional step during which the barriers and the pads are etched.

Another embodiment provides for the method to comprise a subsequent step during which the handle substrate is used to structure another substrate of interest.

Another embodiment provides for the hydrophobic layer to comprise at least one compound containing one or a plurality of halogen atoms and a carbon chain comprising at least 5 carbon atoms.

Another embodiment provides for the hydrophobic compound to be selected from among silanes, in particular chlorosilanes, and polymers, preferably fluoropolymers.

BRIEF DESCRIPTION OF THE DRAWINGS

The foregoing features and advantages, as well as others, will be described in detail in the rest of the disclosure of specific embodiments given as an illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For clarity, only those steps and elements which are useful to the understanding of the described embodiments have been shown and are described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, where reference is made to absolute position qualifiers, such as "front", "back", "top", "bottom", "left", "right", etc., or relative position qualifiers, such as "top", "bottom", "upper", "lower", etc., or orientation qualifiers, such as "horizontal", "vertical", etc., reference is made unless otherwise specified to the orientation of the drawings.

Unless specified otherwise, the expressions "about", "approximately", "substantially", and "in the order of" signify plus or minus 10%, preferably of plus or minus 5%.

There will now be described in further detail the method of forming patterns on a substrate, first referring to FIGS. 1A to 1J.

Figure 1A:
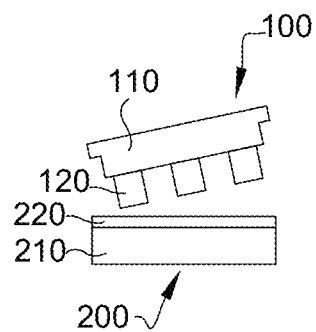
FIGS. 1A, 1B, 1C, 1D, 1E, 1F, 1G, 1H, 1I, and 1J show, schematically, different steps of forming of patterns on a substrate, according to a specific embodiment of the invention.
Figure 1B:
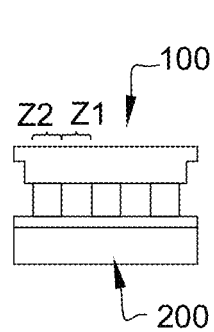
Figure 1C:
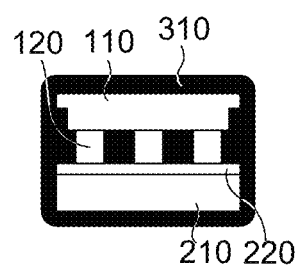
Figure 1D:
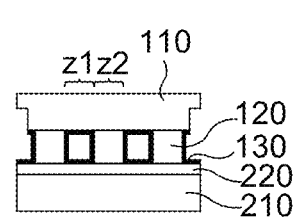
Figure 1E:
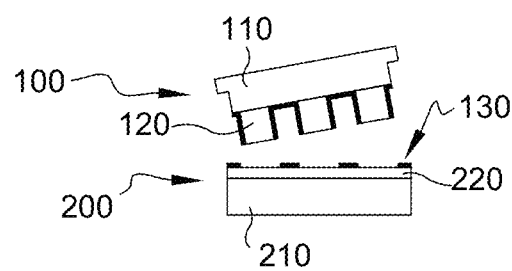
Figure 1F:
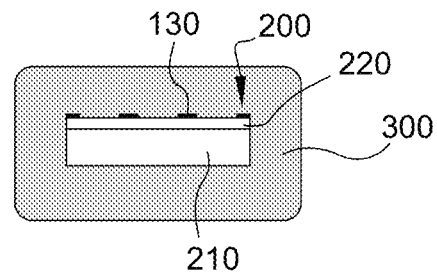
Figure 1G:
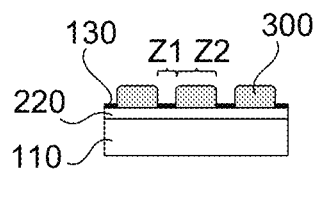
Figure 1H:
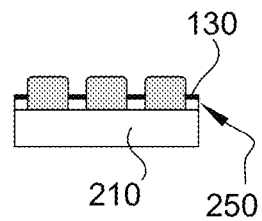
Figure 1I:
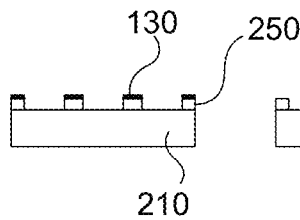
Figure 1J:
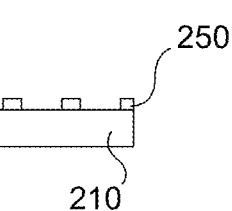

The method comprises the following steps:
a) Bonding a handle substrate 100 to a substrate of interest 200, handle substrate 100 comprising a base 110 and raised elements 120 covering base 110, the substrate of interest 200 comprising a support substrate 210 covered with a thin film 220, thin film 220 comprising a material sensitive to an etchant, whereby thin film 220 comprises first areas Z1 not covered with raised elements 120 and second areas Z2 covered with raised elements 120 (FIGS. 1A and 1B),
b) Forming a hydrophobic layer 130 on the first areas Z1 of thin film 220, for example by placing into contact the assembly obtained at step a) with a solution comprising a hydrophobic compound (typically by immersion) (FIGS. 1C and 1D),
c) Separating handle substrate 100 from the substrate of interest 200 (FIG. 1E),
d) Placing into contact the substrate of interest 200 with an aqueous solution 300 comprising the etchant, hydrophobic layer 130 protecting the first areas Z1, whereby the material sensitive to the etchant present in the second areas Z2 of thin film 220 is etched and raised patterns 250 are formed (Figures IF to 1H),
e) If necessary, removing the excess solution 300 (FIG. 1I) and removing hydrophobic layer 130 (FIG. 1J).

Handle substrate 100 forms a hard mask. It enables to form patterns 250 on the substrate of interest without implementing photolithography steps. The method is thus simple and fast to implement.

Further, with one and the same handle substrate 100, it is possible to form patterns on a plurality of substrates (wafers). The handle substrate is reusable, which further decreases process costs.

Prior to step a), it is possible to carry out one or a plurality of pre-treatments on the surface of handle substrate 100 and/or on the surface of the substrate of interest 200 to make them compatible with a direct bonding.

The pre-treatment may be selected from among the following: thermal anneal, plasma, polishing, and wet cleaning.

As an example, it is possible to form an oxide layer on the surface of handle substrate 100 and/or to carry out a polishing step on handle substrate 100 and/or on the substrate of interest 200 to obtain a roughness compatible with a direct bonding (typically a roughness smaller than 0.5 nm RMS). It is possible to implement methods which combine, for example, a plasma and an aqueous solution, in particular an oxygen plasma followed by a CARO wet cleaning ($H_2SO_4$, $H_2O_2$ in a 5:1 proportion) associated with SC1 ($H_2O$, $NH_3$, $H_2O_2$ in a 5:1:1 proportion at 70° C.).

During step a), handle substrate 100 and the substrate of interest 200 are brought into contact to be bonded.

The two substrates 100, 200 may be assembled by direct bonding. The use of marks on substrates 100, 200 may facilitate their alignment. An accuracy of approximately 100 nm can be achieved. It is also possible to align them, without using marks, by using the edges of the substrates as well as their notch. The accuracy is lower (+/−50 μm), but sufficient for certain applications.

The direct bonding may be carried out at the atmospheric pressure (that is, 1013.25 hPa) or in vacuum. The assembly does not necessarily need to be consolidated by a thermal treatment. However, an anneal, at a temperature preferably lower than 200° C., may advantageously be carried out.

Handle substrate 100 comprises a base 110 and raised elements 120 (pillars or columns). The surface of elements 120 may be of different shapes. It may be square, rectangular, or circular. Raised elements 120 have, for example, a height in the range from 1 μm to 200 μm or more specifically from 10 μm to 100 μm. These elements 120 are preferably spaced apart by more than 10 μm or even more than 50 μm to allow the infiltration of the etchant (gaseous or liquid) by capillarity into the network formed by raised elements 120.

Base 110 and the raised elements may be made of different materials. Preferably, they are made of a same material.

Handle substrate 100 is preferably obtained from a solid substrate. It may be a substrate made of metal or of a semiconductor material, for example.

In particular, the raised elements 120 of handle substrate 100 may be formed by means of a photolithography step, for example by means of the following sub-steps:
locally depositing a resin on a substrate,
etching the portions of the substrate not covered with the resin to form raised elements 120 in the substrate,
removing the resin,
if necessary, trimming the substrate.

The trimming of the wafer edge enables to avoid a possible edge contact between handle substrate 100 and the substrate of interest 200.

The trimming may for example be carried out by photolithography/etching, or also by mechanical trimming by means of a diamond saw. The trimming width is, for example, in the range from 1 to 5 mm and/or its depth is, for example, in the range from 100 to 250 μm.

At step b), a hydrophobic layer is formed on the first areas (Z1) of the thin film (220). The layer may also be called film.

The selection of hydrophobic layer 130 will depend, in particular, on the substrate of interest 200 and on the etching solution 300.

Hydrophobic layer 130 has, for example, a thickness in the range from 2 nm to 100 nm.

Hydrophobic layer 130 may be obtained from a polymer, from a silyl (also called organo-silyl), or from a silane.

The selected hydrophobic compound preferably comprises one or a plurality of halogen groups, in particular fluorine or chlorine groups. Preferably, the hydrophobic compound comprises a carbon chain of at least 5 carbon atoms.

The silane may be a chlorosilane such as octadecyltrichlorosilane (OTS=CH$_3$(—CH$_2$)$_{17}$—SiCl$_3$) commercialized by Sigma Aldrich.

The polymers may be fluoropolymers such as for example the Novec™ 1720 EGC polymer commercialized by 3M™, Optool commercialized by DAIKIN, and the Novec™ 2202 EGC polymer commercialized by 3M™. The hydrophobic compound may be selected from among chlorosilanes such as perfluorodecyl-trichlorosilane (FDTS=Cl$_3$Si(CH$_2$)$_2$(CF$_2$)$_7$ CF$_3$) commercialized by Sigma-Aldrich, perfluorodecyldimethylchlorosilane (FDDMCS=CF$_3$ (CF$_2$)$_7$(CH$_2$)$_2$(CH$_3$)$_2$SiCl) commercialized by Sigma-Aldrich.

Preferably, hydrophobic layer 130 is deposited by liquid deposition, by soaking the assembly formed by handle substrate 100 and by the substrate of interest 200 in a solution containing the hydrophobic compound(s) intended to form the hydrophobic layer 130 on the first areas Z1 of thin film 220. The liquid infiltrates into the network formed by raised elements 120. The trimming facilitates the entry of liquid at the edge of the bonded structures.

After step b), a rinsing step and, optionally, a drying step may be carried out. The drying may be carried out by centrifugation.

An anneal may enable to dry and/or to stabilize hydrophobic layer 130.

During step c), handle substrate 100 is separated from substrate 200. The assembly may be disassembled by for example inserting a wedge between the two substrates 100, 200.

Handle substrate 100 may be used in a new bonding/etching cycle. A cleaning is advantageously carried out between each use.

For example, it is possible to recycle it by implementing an oxygen plasma treatment followed by a wet cleaning.

Alternatively, since the bases of the raised elements 120 of handle substrate 100 have not been exposed to the hydrophobic compound, they are still compatible with a direct bonding. Handle substrate 100 can thus be directly reused.

At step d), the substrate of interest 200 is placed into contact with an aqueous solution 300 containing the etchant, for example by immersion.

The duration for which the second areas Z2 are in contact with etching solution 300 will depend on the thickness of material to be etched.

During the etch step, it is possible for hydrophobic layer 130 to be thinned by a few tens of percent. The duration of the etch step and/or the thickness of hydrophobic layer 130 will be selected so as not to lead to the full removal of hydrophobic layer 130.

Figure 2:
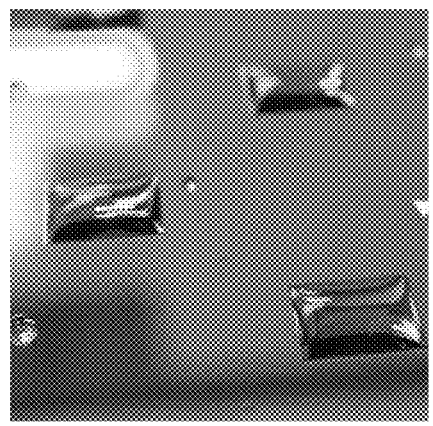
FIG. 2 is a photographic image of a wafer comprising hydrophobic and hydrophilic areas, obtained according to a specific embodiment of the invention, and on which an aqueous solution has been deposited.
Figures 3A, 3B, 3C, 3D:
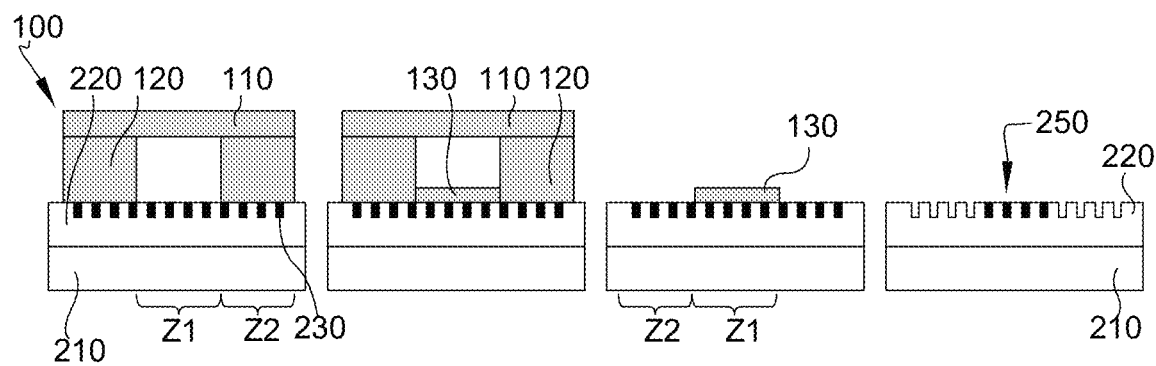
FIGS. 3A, 3B, 3C, and 3D show, schematically, different steps of a method of structuring a substrate of interest according to another specific embodiment, the substrate being shown in cross-section.
Figures 3E, 3F:
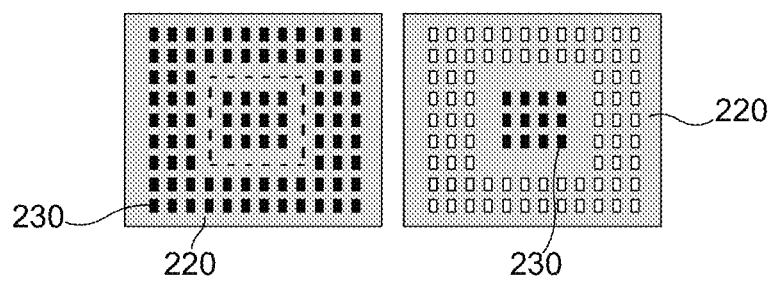
FIGS. 3E and 3F show, schematically and in top view, the substrate shown in FIGS. 3C and 3D respectively, the dotted lines representing the position of the hydrophobic layer.
Figure 4A:
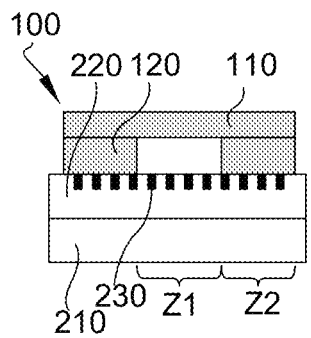
FIGS. 4A, 4B, 4C, and 4D show, schematically, different steps of a method of structuring a substrate of interest according to another specific embodiment, the substrate being shown in cross-section.
Figure 4B:
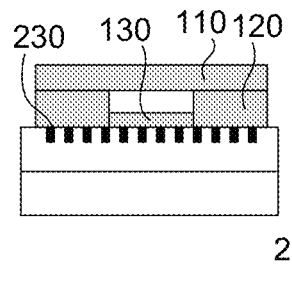
Figure 4C:
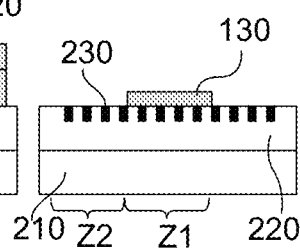
Figure 4D:
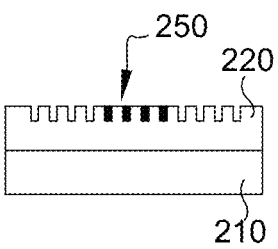
Figure 4E:
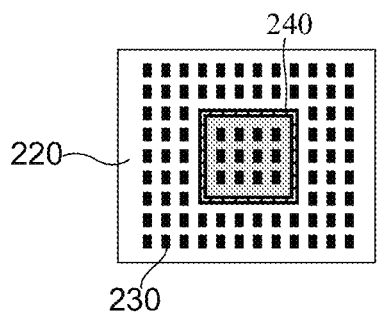
FIGS. 4E and 4F show, schematically and in top view, the substrate shown in FIGS. 4C and 4D respectively, the dotted lines representing the position of the hydrophobic layer.
Figure 4F:
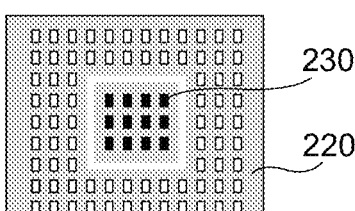

It is also possible to fully immerse substrate 200 in solution 300 and to take it out immediately after. The first areas Z1 being covered with hydrophobic layer 130, when the plate is taken out, a de-wetting of aqueous solution 300 on the first hydrophobic areas Z1 occurs and solution 300 is confined to the second areas Z2 comprising no hydrophobic coating (FIG. 1G and FIG. 2).

Thus, only the material sensitive to the etchant present in the second areas Z2 is etched (FIG. 1H). Raised patterns 250 are thus formed.

At the end of step d), the assembly may be rinsed and then dried. The drying may be carried out by centrifugation.

If necessary, it is possible to repeat step d). This is particularly advantageous in the case where support substrate 210 is covered with a stack of a plurality of thin films. Thus, it is possible to use a plurality of etchants to etch the various thin films of the stack.

During step e), hydrophobic layer 130 may be removed from areas Z1. It is for example possible to use an oxygen plasma followed by a CARO wet cleaning associated with an SC1.

The substrate of interest and its different possible configurations will now be described in further detail.

The substrate of interest 200 comprises support substrate 210 covered with thin film 220 comprising at least one material sensitive to an etchant.

The substrate of interest 200 may be an SOI ('Silicon on Insulator') substrate, that is, comprising a support substrate 210 covered with a thin buried oxide layer and a silicon layer 220. The thin oxide layer may play the role of an etch stop layer (vertical etching).

Alternatively, it may be a solid substrate 210 made of semiconductor material (for example silicon) covered with a dielectric layer 220, in particular an oxide layer (silicon oxide in particular).

For certain applications, thin film 220 may comprise a base material (oxide in particular) and pads 230, in particular metal pads (FIGS. 3A to 3F). Pads 230 may be evenly or irregularly distributed.

In the case where the etch-sensitive material corresponds to pads 230, the base material is not etched, and a thin film 220 comprising a plurality of holes (blind or running through thin film 220) and raised patterns 250 (FIGS. 3A to 3F) is obtained. The holes are obtained after etching of pads 230. Raised patterns 250 correspond to the first portions Z1 of the thin film 220 which used to be protected by hydrophobic layer 130.

In the case where the etch-sensitive material corresponds to the base material, pads 230 are not etched, and a support substrate 210 covered with pads in the second areas Z2 and with patterns 250 in the first areas Z1 is obtained. Patterns 250 may comprise the base material and the pads.

Pads 230 may be surrounded by a protective layer for protecting them during the etch step. For example, Ti and TiN or Ta and TaN layers may surround copper pads 230. Specific types of etching may then be used for these materials.

According to a specific embodiment, elements 240 may be arranged within thin film 220. These elements 240 form vertical walls in thin film 220. These elements 240 surround the first areas Z1. They form protective barriers 240 enabling to stop lateral overetching, which may sometimes accompany the vertical etching of the etched material. The width of this barrier will be selected so as to be sufficiently significant to stop the overetching. Elements 240 may have identical or different shapes. They are, of course, made of a material different from the material sensitive to the etchant.

The positioning of elements 240 is selected so as to surround the first areas Z1 to be protected.

When thin film 220 comprises protective barriers 240, the method may comprise, after step d), an additional step during which protective barriers 240 are removed.

According to a specific embodiment, thin film 120 comprises a base material, protective barriers 240, and pads 230 (FIGS. 4A to 4F and 5A to 5C).

According to a first alternative embodiment, protective barriers 240 and pads 230 are sensitive to the same etchant. Protective barriers 240 are preferably made of the same material as pads 230. Even more preferably, it is a metal, such as copper. Advantageously, the base material is an oxide, for example a silicon oxide. Protective barriers 240 and pads 230 can thus be removed during a single etch step (FIG. 4A to 4F). A thin film 220 comprising a plurality of holes (blind or running through thin film 220) in the second areas Z2 is thus obtained. The first areas Z1 of thin film 220 facing raised elements 120 are preserved during the etch step, and raised patterns 250 are formed.

Figure 5A:
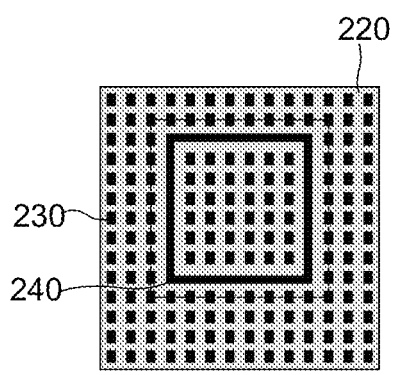
FIGS. 5A, 5B, and 5C schematically show different steps of a method of structuring a substrate of interest according to another specific embodiment, the substrate being shown in top view and the dotted lines representing the position of the hydrophobic layer.
Figure 5B:
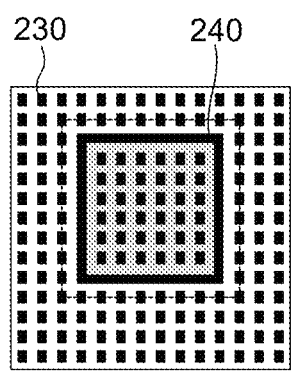
Figure 5C:
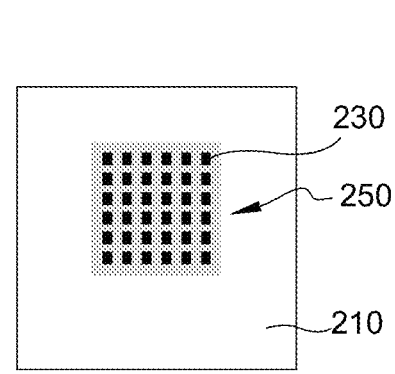

According to a second embodiment shown in FIGS. 5A to 5C, the base material is sensitive to the etchant. The protective barriers 240 of the base material and pads 230 are not sensitive to the etchant (FIG. 5A). Protective barriers 240 and pads 230 may be made of the same material or of different materials. For example, protective barriers 240 and pads 230 are made of metal, preferably of copper. The base material is, for example, an oxide, and in particular a silicon oxide. During the etch step, the base material present in the second areas Z2 is etched. Protective barriers 240 and metal pads 230, not sensitive to the etching element, are preserved during the etch step (FIG. 5B). A structure comprising raised patterns 250 surrounded by protective barriers 240 is obtained. Raised patterns 250 comprise the base material having pads 230 dispersed therein. Patterns 250 are surrounded by protective barriers 240. Between patterns 250, at the level of the second areas Z2, support substrate 210 is covered with metal pads 230 (FIG. 5B).

It is possible to perform an additional etch step (or a plurality of additional etch steps) to remove metal pads 230 and/or protective barriers 240 (FIG. 5C).

Metal barriers 240 and/or metal pads 230 may be inserted into the oxide layer, for example with a Damascene-type method.

In particular, it is possible to select metal barriers 240 and/or copper metal pads 230 inserted in a silicon oxide layer.

Metal barriers 240 and/or metal pads 230 may be formed, for example, by physical vapor deposition (PVD) and/or by electrochemical deposition (ECD).

Preferably, to form copper 230 elements by ECD, Ti, TiN, and Cu layers will previously be deposited by PVD. The ECD deposition enables to form elements have larger thicknesses than PVD. It is also possible to replace the Ti and TiN layers with Ta and TaN layers. The Ti/TiN or Ta/TaN layers play the role of a barrier to the diffusion of copper into the silicon.

The different variants of the previously-described method result in the obtaining of a substrate of interest comprising a support substrate covered with raised patterns 250. The thickness of the patterns depends on the targeted application. The patterns may be formed of the base material (FIG. 1J), or of the base material having pads 230 dispersed therein (FIGS. 3D, 3F, 4D, 4F). A protective barrier 240 may surround patterns 250 (FIG. 5B).

Apart from patterns 250, a plurality of different embodiments are possible, and in particular:
   support substrate 210 may be covered with a thin film 220 exhibiting blind holes (FIGS. 3F, 4F) or holes running through said layer 220,
   pads 230 may be positioned on support substrate 210 (FIG. 5B),
   support substrate 210 may have a free surface (that is, apart from the patterns, no element covers support substrate 210) (FIGS. 1J, 5C).

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

Illustrative and Non-Limiting Examples of Different Embodiments

In the following examples, the substrates are formed from silicon wafers having a 200-mm diameter.

Example 1

Handle substrate 100 is formed from a silicon wafer having undergone an oxidation to obtain a 2-μm film of silicon oxide on the surface. A photolithography/etching method enables to form raised elements 120 of 10×10 mm$^2$ and having a 100-μm thickness. A trimming of the edge of substrate 100 is performed with a diamond saw. The trimming has a 3-mm width and a 200-μm depth. The oxide surface of the wafer is cleaned by an $O_2$ plasma followed by a CARO, SC1 wet cleaning to be made compatible with a direct bonding method.

The substrate of interest 200 is an SOI wafer comprising a solid substrate 210 covered with a silicon film 220 having a 205-nm thickness and a 400-nm buried oxide layer. The substrate of interest 200 undergoes a wet cleaning to be made compatible with a direct bonding method.

The two substrates 100, 200 are directly bonded to each other. The assembly is soaked for 2 min in a solution of OTS in isooctane. The assembly is then rinsed by immersion in isooctane and then dried by centrifugation. A hydrophobic film 130 is formed on the areas Z1 of thin film 220 not covered with the raised elements 120 of handle substrate 100.

Handle substrate 100 is disassembled by inserting a wedge into the structure.

A wafer 200 comprising hydrophobic area Z1 outside of the areas Z2 which were protected by the raised elements 120 of handle substrate 100.

This wafer 200 is soaked in a 5% TMAH aqueous solution. After being taken out of the liquid, wafer 200 is placed horizontally on a hot plate at 70° for 3 min, then rinsed in water and dried by centrifugation. The silicon layer 200 exposed to TMAH is etched down to the buried oxide layer, which plays the role of a barrier layer. Hydrophobic film 130 is removed by an oxygen plasma treatment and the surface is wet cleaned (CARO and SC1).

The obtained silicon wafer 200 exhibits silicon patterns (pads) 250 of 10×10 mm$^2$ having a 205-nm thickness.

Example 2

Handle substrate 100 is obtained from a silicon wafer as described in example 1. It exhibits rectangular raised elements 120 of 10×5 mm$^2$ having a 15-μm thickness.

A wafer (substrate) 200 undergoes an oxidation to form a film 220 of 100 nm of oxide on its surface. Substrate 200 is wet-cleaned to be made compatible with a direct bonding method.

The two substrates 100, 200 are directly bonded. The obtained assembly is soaked for 2 min in the NOVEC 1720 EGC liquid 310. The assembly is then rinsed by immersion in the NOVEC 7100 EGC solvent and then dried by centrifugation. Handle substrate 100 is disassembled by inserting a wedge into the structure. The substrate of interest 200 undergoes a thermal treatment for 15 min at 135° C.

A substrate of interest 200 having its thin film 220 comprising hydrophobic areas Z1 outside of the areas Z2 initially protected by the raised elements 120 of handle substrate 100 is obtained.

The substrate of interest 200 is then soaked in a 5 vol. % aqueous HF solution. After its taking out of the liquid, wafer 200 is placed horizontally for 3 min, then rinsed by immersion in water and dried by centrifugation. The portion of silicon oxide 220 exposed to the HF solution is etched. Hydrophobic film 130 is removed by oxygen plasma treatment and the surface is wet cleaned (CARO and SC1).

A silicon substrate 200 which exhibits rectangular silicon oxide patterns 250 (pads) of 10×5 mm² having a 100-nm thickness is obtained.

Example 3

A handle substrate 100 is manufactured from a silicon wafer as described in example 1. The substrate exhibits cylindrical elements 120 having a 5-mm diameter and a 60-μm thickness.

On a wafer, there is deposited 400 nm of oxide from TEOS. There are then deposited by PVD Ti, TiN, and Cu layers having a thickness of 10, 50, and 200 nm. Finally, an electrochemical ECD treatment enables to deposit a 300-nm Cu film 220. A copper polishing step removes a copper thickness of 200 nm and enables to prepare the surface of the substrate for a direct bonding.

The two substrates 100, 200 are directly bonded. The assembly is soaked for 2 min in a solution 310 of FDTS in isooctane. The assembly is then rinsed by immersion in isooctane and then dried by centrifugation. Handle substrate 100 is removed by inserting a wedge into the structure.

On wafer 200, hydrophobic areas Z1 outside of the areas Z2 protected by raised elements 120 during the bonding with handle substrate 100 are obtained.

Wafer 200 is soaked in an aqueous solution of DSP ($H_2SO_4$/$H_2O_2$/$H_2O$ in a Jan. 2, 1950 proportion) to etch the copper layers. After being taken out of the liquid, wafer 200 is placed horizontally for 3 min. The assembly is then rinsed by immersion in water and then dried by centrifugation. Copper layer 220 is etched according to the patterns defined by the raised elements 120 of handle substrate 100.

Wafer 200 is then soaked in an SC1 solution. After being taken out of the liquid, wafer 200 is placed horizontally on a hot plate at 70° C. for 2 min, then rinsed and dried. The Ti and TiN layers are etched according to the patterns defined by the raised elements 120 of handle substrate 100. Hydrophobic film 130 is removed by an oxygen plasma treatment, after which the surface is wet cleaned (CARO and SC1).

A plate of interest 200 comprising a silicon support substrate 210 covered with cylindrical raised copper patterns 250 (pads) of 5 mm² having a 300-nm thickness is obtained.

The invention claimed is:

1. Method of forming patterns on a substrate comprising the following steps:
    a) Bonding a handle substrate to a substrate of interest, the handle substrate comprising a base and raised elements covering the base, the substrate of interest comprising a support substrate covered with a thin film, the thin film comprising a material sensitive to an etchant, whereby the thin film comprises first areas not covered with the raised elements and second areas covered with the raised elements,
    b) Forming a hydrophobic layer on the first areas of the thin film, for example by placing into contact the assembly obtained at step a) with a solution comprising a hydrophobic compound,
    c) Separating the handle substrate from the substrate of interest,
    d) Placing into contact the substrate of interest with an aqueous solution comprising the etchant, whereby the material sensitive to the etchant present in the second areas of the thin film is etched and raised patterns are formed.

2. Method according to claim 1, wherein the thin film comprises a base material, the base material preferably being a semiconductor material, for example silicon, or an oxide, for example a silicon oxide.

3. Method according to claim 1, wherein the thin film comprises a base material, for example an oxide, preferably a silicon oxide, having pads, preferably metal pads, and even more preferably copper pads, arranged therein.

4. Method according to claim 3, wherein the material sensitive to the etchant is the base material.

5. Method according to claim 3, wherein the material sensitive to the etchant corresponds to the pads.

6. Method according to claim 1, wherein the thin film comprises barriers, preferably metal barriers, and more particularly copper barriers, forming a lateral protection all around the second areas.

7. Method according to claim 5, wherein, during the etch step, the barriers and the pads are etched.

8. Method according to claim 4, wherein the method comprises, after step c), an additional step during which the barriers and the pads are etched.

9. Method according to claim 1, wherein the method comprises a subsequent step during which the handle substrate is used to structure another substrate of interest.

10. Method according to claim 1, wherein the hydrophobic layer comprises at least one compound comprising one or a plurality of halogen atoms and a carbon chain comprising at least 5 carbon atoms.

11. Method according to claim 1, wherein the hydrophobic compound is selected from among silanes, in particular chlorosilanes, and polymers, preferably fluoropolymers.

* * * * *

UNITED STATES PATENT AND TRADEMARK OFFICE
CERTIFICATE OF CORRECTION

| | | |
|---|---|---|
| PATENT NO. | : 12,230,508 B1 | Page 1 of 1 |
| APPLICATION NO. | : 18/805861 | |
| DATED | : February 18, 2025 | |
| INVENTOR(S) | : Pierre Montmeat et al. | |

It is certified that error appears in the above-identified patent and that said Letters Patent is hereby corrected as shown below:

On the Title Page

Item (30) should read:
(30) Foreign Application Priority Data
Aug. 18, 2023 FR ................... 2308800

Signed and Sealed this
Eighth Day of April, 2025

Coke Morgan Stewart
*Acting Director of the United States Patent and Trademark Office*